Oct. 4, 1966 C. W. HORSTING ETAL 3,276,915

STRESS EQUALIZED THERMOELECTRIC DEVICE

Filed May 9, 1963

INVENTORS
CAREL W. HORSTING &
NICHOLAS E. PRYSLAK
BY

ATTORNEY

United States Patent Office 3,276,915
Patented Oct. 4, 1966

3,276,915

STRESS EQUALIZED THERMOELECTRIC DEVICE

Carel W. Horsting, Caldwell, and Nicholas E. Pryslak, Summit, N.J., assignors to Radio Corporation of America, a corporation of Delaware Filed May 9, 1963, Ser. No. 279,344
7 Claims. (Cl. 136—205)

Figure 1:
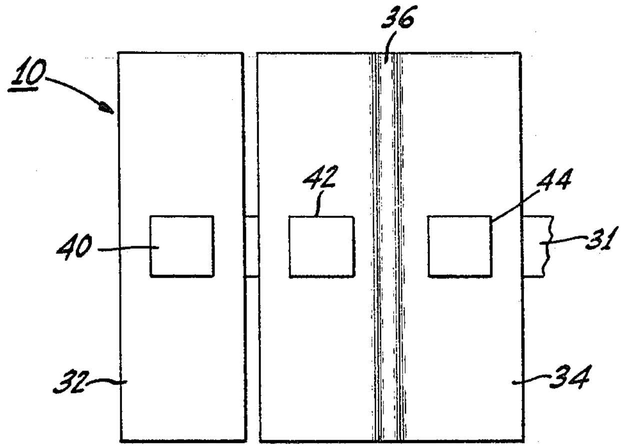

The invention described herein was made in the course of a contract with the U.S. Atomic Energy Commision.

This invention relates generally to thermoelectric devices, and more particularly to an improved construction for a thermoelectric device to reduce stresses usually caused therein by the difference in the coefficients of thermal expansion between adjacents parts. The improved, stress equalizing construction of the present invention is particularly useful in thermoelectric devices that utilize the ambient as a heat sink.

In certain types of thermoelectric devices, such as in a thermoelectric generator, which operates in accordance with the Seebeck effect, it is necessary to apply a source of heat to the hot end of each thermoelement of the device and to cool the cold end of each thermoelement by means of a radiator exposed to the ambient. Since the difference in temperature between the hot and cold ends of a thermoelement may be several hundred degrees C., portions of the thermoelectric device are placed under great stresses due to the difference in the coefficients of thermal expansion of adjacent parts of the device. This is especially true in thermoelectric generators that employ semiconductor thermoelements with metal shoes and metal straps for connecting adjacent thermoelements to each other. Where aluminum is bonded to the cold shoe of a semiconductor thermoelement for radiating heat into the ambient, great stresses are placed on the semiconductor thermoelement during the operation thereof. Since part of these stresses are tensile in nature, and since the semiconductor thermoelement is comparatively weak in tension, fractures may occur in the thermoelement during the operation thereof. Unless these stresses are minimized or equalized, reliable operation of thermoelectric generators of the type described may not be possible at relatively high temperatures.

It is an object of the present invention to provide an improved construction of a thermoelectric device that will tend to equalize or minimize stresses in adjacent parts due to the difference in the coefficients of thermal expansion of these parts.

Another object of the present invention is to provide an improved construction for a thermoelectric device wherein a metal heat radiating member may be bonded to the shoe of a semiconductor thermoelement.

A further object of the present invention is to provide an improved thermoelectric generator wherein metal radiator fins may be used to radiate heat to the ambient when the latter is used in a heat sink.

A still further object of the present invention is to provide an improved thermoelectric generator that is relatively simple in construction, easy to operate, and highly efficient in use.

Briefly, the improved construction of a thermoelectric device according to the present invention comprises means to equalize the stresses on both sides of one part that is fixed to another part where the coefficients of thermal expansion of these parts are different. In a thermoelectric generator, for example, where its thermoelements are providd with hot and cold tungsten shoes, and where an aluminum radiator is bonded to the cold tungsten shoe, the stresses that would normally occur between the aluminum radiator and the tungsten shoe are equalized, or minimized, according to the present invention, by bonding a compensating platelet to the aluminum radiator on the surface opposite to the cold shoe, the material and shape of the compensating platelet being substantially the same as those of the cold shoe.

Figure 2:
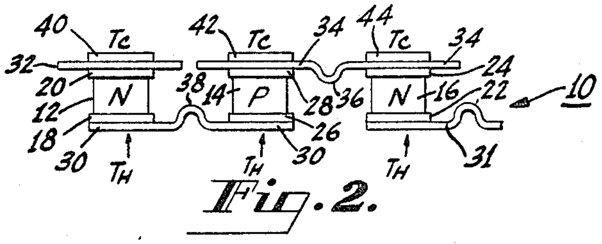

The novel features of the present invention, both as to its organization and method of construction, as well as additional objects and advantages thereof, will be more readily understood from the following description, when read in connection with the accompanying drawing, in which the same reference characters designate similar parts throughout, and in which:

FIG. 1 is a plan view of a portion of a thermoelectric generator employing the stress equalization construction of the present invention; and FIG. 2 is a side elevational view of the portion of the thermoelectric generator shown in FIG. 1.

Referring, now, in greater particularity to the drawing, there is shown a portion of a thermoelectric generator 10 employing a plurality of thermoelements 12, 14 and 16. The thermoelements 12 and 16 may be of a semiconductor material, such as a silicon-germanium alloy, comprising at least 50 atomic percent of silicon that has been doped to provide an N-type conductivity. The thermoelement 14 may also comprise a semiconductor of silicon-germanium alloy comprising at least 50 atomic percent silicon that has been doped to provide a P-type conductivity.

Hot and cold metal shoes 18 and 20, respectively, are fixed to the hot and cold ends of the thermoelement 12 by any suitable means, such as by diffusion bonding under suitable pressure and heat in vacuo. Similarly, the thermoelement 16 is provided with hot and cold metal shoes 22 and 24, and the thermoelement 14 is provided with hot and cold metal shoes 26 and 28, respectively. The hot and cold metal shoes are preferably of a metal that has substantially the same coefficient of expansion as the thermoelements to which they are attached. Shoes of tungsten are suitable for thermoelements of silicon-germanium alloy.

A hot strap 30 of metal, such as copper, is bonded to the hot shoes 18 and 26 of the thermoelements 12 and 14, respectively, by any suitable means, such as by copper brazing. The hot strap 30 serves primarily as an electrical connection between the thermoelements 12 and 14 and incidentally as a means for applying heat to the hot ends of the thermoelements 12 and 14 sufficient to maintain them at a relatively high temperature $T_H$. A hot strap 31 is bonded to the hot shoe 22 of the thermoelement 16.

A heat radiator 32 of a heat radiating material, such as silver, copper or aluminum, for example, is bonded to the cold shoe 20 of the thermoelement 12 for radiating heat from the cold end of the thermoelement 12 into the ambient. The radiator 32 is a relatively large sheet of metal to function as an efficient dissipator of heat. A large heat radiator 34 is bonded to the shoes 28 and 24 of the thermoelements 14 and 16, respectively, to function as a dissipator of heat for the cold ends of the thermoelements 14 and 16. The radiator 34 also serves as an electrical connection, that is, a strap, between the cold shoes 28 and 24 of the thermoelements 14 and 16 and has a looped portion 36 at about its middle portion to provide for its expansion and contraction during the operation of the thermoelectric generator 10. The hot strap 30 is also formed with a looped portion 38 to allow for its expansion and contraction during operation of the thermoelectric generator 10.

Since the material of the radiators 32 and 34 has a different coefficient of thermal expansion from the material of the cold shoes 20, 28 and 24, means are provided to equalize the stresses that form between these materials when the thermoelectric generator 10 is in operation. To this end, a compensator in the form of a compensating platelet 40 is bonded to the upper surface of the radiator 32 in stacked alignment with the cold shoe 20. Compensating platelets 42 and 44 are bonded to the upper surface of the radiator 34 in stacked alignment with cold shoes 28 and 24, respectively. The material and shape of the platelets 40, 42 and 44 are similar to the material and shape of the cold shoes 20, 28 and 24, respectively. It will now be understood that any tendency for the cold shoes of the thermoelements to distort the radiators will be offset by the compensating platelets, the latter applying compensating forces to the radiators to prevent their distortion. Thus, for example, the tendency for the radiator 32 to bend in one direction due to stresses caused by the difference in the coefficients of thermal expansion between the cold shoe 20 and the radiator 32 is offset by equalizing stresses produced by the compensating platelet 40 that tend to bend the radiator in an opposite direction. Hence, the radiator remains substantially unchanged. Similarly, the tendency for the radiator 34 to transfer stresses directly to the cold shoes 28 and 24 and indirectly to the thermoelements 14 and 16 is offset by the compensating stresses produced on the radiator 34 by the platelets 42 and 44.

In operating the thermoelectric generator 10, heat is applied to the hot ends of the thermoelements 12, 14 and 16 via the straps 30 and 31 to bring them to the temperature $T_H$, and the radiators 32 and 34 are exposed to the ambient, the latter having a relatively cooler temperature $T_C$. Under these conditions, a difference in potential is established between the thermoelements 12 and 14, and between the thermoelements 14 and 16. Where the radiators 32 and 34 are of aluminum and the cold shoes to which they are bonded are of tungsten, there is a strong bi-metallic effect created when these parts are heated, aluminum having a coefficient of thermal expansion that is many times greater than that of tungsten. The compensating platelets 40, 42 and 44, however, provide equalizing stresses to the side of the radiators remote from the cold shoes, thereby preventing distortion of the radiators and the transference of any stresses to the relatively fragile semiconductor thermoelements.

The stresses between the hot shoes 18 and 26 and the hot strap 30, for example, may also be compensated by the addition of platelets (not shown) in the manner described, but the device 10 is usually attached to a heat conveying member of, or through, a material whose coefficient of expansion is substantially similar to that of the hot shoes, thereby compensating for the aforementioned stresses.

From the foregoing description, it will be apparent that there has been provided an improved construction of a thermoelectric device in which stresses due to the difference in the coefficients of thermal expansion between adjacent parts is equalized or greatly minimized. While only one embodiment of the present invention has been described, variations and modifications in the stress equalizing construction, all coming within the spirit of this invention, will, no doubt, readily suggest themselves to those skilled in the art. Hence, it is desired that the foregoing shall be considered as illustrative and not in a limiting sense.

What is claimed is:

1. In a thermoelectric device of the type wherein a thermoelement has a shoe of tungsten bonded to one end thereof, and a radiator of aluminum bonded to said shoe, the improvement comprising a platelet of tungsten of a shape similar to that of said shoe, said platelet being bonded to a side of said radiator remote from said shoe and in stacked alignment with said shoe.

2. A thermoelectric device comprising
(a) a thermoelement having hot and cold ends,
(b) a tungsten shoe fixed to each of said ends,
(c) a radiator of aluminum having one side fixed to one of said shoes, and
(d) a compensating platelet of tungsten and having a shape similar to that of said one shoe fixed to the other side of said radiator.

3. A thermoelectric generator comprising, in combination,
(a) a hot strap,
(b) a hot shoe of tungsten bonded to said hot strap,
(c) a semiconductor thermoelement having a hot end and a cold end, said hot end being bonded to said hot shoe,
(d) a cold shoe of tungsten bonded to said cold end,
(e) a radiator sheet of a different material having one side bonded to said cold shoe, and
(f) a platelet of tungsten bonded to the other side of said radiator to equalize stresses on said radiator due to the difference in the coefficients of thermal expansion of said cold shoe and said radiator.

4. A thermoelectric generator comprising, in combination,
(a) a hot strap,
(b) a hot shoe of tungsten bonded to said hot strap,
(c) a thermoelement of silicon-germanium alloy having a hot end and a cold end, said hot end being bonded to said hot shoe,
(d) a cold shoe of tungsten bonded to said cold end,
(e) a radiator of a sheet of aluminum having one side bonded to said cold shoe, and
(f) a compensating platelet of tungsten bonded to the other side of said sheet of a size and shape to equalize stresses on said radiator due to the difference in the coefficients of thermal expansion of said cold shoe and said radiator.

5. A thermoelectric device comprising:
(a) a thermoelement of a thermoelectric material having a given coefficient of thermal expansion;
(b) a shoe of a metal having substantially the same coefficient of expansion as said thermoelectric material bonded to one end of said thermoelement;
(c) a strap of a different metal having a substantially different coefficient of thermal expansion bonded to said shoe; and
(d) a temperature compensating platelet of a material having substantially the same coefficient of thermal expansion as said shoe bonded to the other side of said strap.

6. A thermoelectric device as in claim 5, wherein said thermoelectric material is a silicon-germanium alloy, and said shoe and platelet are made of tungsten.

7. A thermoelectric device as in claim 6, wherein said strap is made of aluminum.

References Cited by the Examiner

UNITED STATES PATENTS

| | | | |
|---|---|---|---|
| 3,110,628 | 11/1963 | Ramey et al. | 136—4 |
| 3,136,134 | 6/1964 | Smith | 136—4 X |

WINSTON A. DOUGLAS, *Primary Examiner.*

CARL D. QUARFORTH, *Examiner.*

ALLEN B. CURTIS, J. D. VOIGHT, *Assistant Examiners.*